United States Patent [19]

Tanaka

[11] 3,973,205
[45] Aug. 3, 1976

[54] TELEVISION TUNING SYSTEM INDICATOR

[75] Inventor: Akio Tanaka, Evanston, Ill.

[73] Assignee: Zenith Radio Corporation, Chicago, Ill.

[22] Filed: Oct. 3, 1974

[21] Appl. No.: 511,837

[52] U.S. Cl. .............................. 325/455; 325/464; 340/324 R
[51] Int. Cl.² ......................................... H04B 1/16
[58] Field of Search .................... 325/455, 459, 464; 340/336, 325, 324 R; 334/15

[56] References Cited
UNITED STATES PATENTS

| | | | |
|---|---|---|---|
| 3,636,329 | 1/1972 | DeSipio et al. ..................... | 340/336 |
| 3,732,545 | 5/1973 | Hatano et al. ..................... | 340/172.5 |
| 3,749,896 | 7/1973 | Munt.............................. | 340/324 R |
| 3,846,707 | 11/1974 | Sakamoto et al. ................... | 334/15 |

*Primary Examiner*—Robert L. Griffin
*Assistant Examiner*—Michael A. Masinick
*Attorney, Agent, or Firm*—Joseph T. Downey; Nicholas A. Camasto

[57] ABSTRACT

An all channel television varactor diode tuning system has a presettable counter for deriving the number of the receivable television channel by counting pulses indicative of the tuner local oscillator frequency, which is varied by a voltage ramp circuit under the control of a comparator. The derived channel number is supplied to one input of the comparator, and a channel number selector supplies an encoded desired two digit channel number to the other comparator input and to a frequency band decoder. The band decoder supplies signals to establish appropriate preset counts for the counter in accordance with the frequency band. The channel number selector includes a keyboard coupled to a multi-location tens and units memory for encoding and storing desired channel numbers. The keyboard is also coupled to a function/number decoder which distinguishes between digits and controls the state of a flip/flop in decoder circuitry which subsequently controls a units and tens position display device. The flip/flop, through logic circuitry, enables display of a first digit entered at the keyboard in the tens display position while blanking the units position and enables both display positions only for completed two digit channel number entries.

13 Claims, 2 Drawing Figures

TELEVISION TUNING SYSTEM INDICATOR

CROSS REFERENCE TO RELATED PATENT APPLICATIONS

This application is related to the following applications all of which are assigned to the assignee of the present application and all of which are hereby incorporated by reference. Ser. No. 326,724, filed Jan. 26, 1973, now U.S. Pat. No. 3,851,254 issued Nov. 26, 1974 entitled "Digital Systems and Method for Determining and Displaying a Television Channel Number", in the names of Richard G. Merrell and Akio Tanaka, Ser. No. 430,446, filed Jan. 3, 1974, entitled "Channel Seeking Tuning System", in the name of Akio Tanaka (hereafter referred to simply as thhe Tanaka application), Ser. No. 457,010, filed Apr. 1, 1974, entitled "Digital Signal Seeking Tuning System", in the names of John Ma and Akio Tanaka, Ser. No. 466,579, filed May 3, 1974, entitled "All Electronic Digital Tuner System with Memory" in the names of John Ma and Akio Tanaka, Ser. No. 484,475, filed July 1, 1974, entitled "Band Decoder for All Channel Digital Tuning System" in the name of Akio Tanaka, Ser. No. 492,365, filed July 29, 1974, entitled "Signal Seeking Tuning System with Illegal Channel Detection" in the name of Akio Tanaka, Ser. No. 503,122, filed Sept. 4, 1974, entitled "Television Tuning System with Varactor Malfunction Detection" in the name of Akio Tanaka, and Ser. No. 504,638, filed Sept. 9, 1974, entitled "Multi-Speed Ramp for a Varactor Tuning System" in the names of Melvin C. Hendrickson and Richard G. Merrell.

BACKGROUND OF THE INVENTION

The present invention relates generally to tuning systems and more particularly to all channel electronic television tuning systems having a time-sequenced counting system for deriving the channel number of a receivable television signal from the frequency of the local oscillator and a comparator-controlled source of tuning voltage. The receiver is tuned by comparing the derived channel number with a desired two digit channel number. Specifically, it relates to an interactive display system for visually indicating the channel number of the receivable television signal.

U.S. Pat. No. 3,671,896 to Wolfram shows a channel indicator employing a two digit segmented display device for channel numbers. A limited number of double-throw switches, each having simultaneously operable tens and units poles, are wired to encoding matrices to cause the display devices to display the channel number of the correspondingly wired switch.

A paper by Sakamoto and Ichinohe (BTR, Vol. 18, No. 3, Aug., 1972) includes a very limited description of a channel selection and display system employing a plurality of individual preset potentiometers, for applying voltages to a varactor tuner, which are identifiable by channel numbers. Access is through a ten digit keyboard coupled to an 8 bit shift register for enabling logic gates in a matrix. No operational details are given.

Since the FCC allocated channel numbers extend from 2 through 83, both one digit and two digit channel numbers are employed. All-channel tuners must therefore accommodate selection of both dual digit and single digit channel numbers. A digit entry tuning system may provide a separately activated tuning command switch, operable after channel number selection, or respond only to entry of both digits of two digit channel numbers. This latter system should distinguish between the entry of a 2 for tuning channel 2 and a 2 as the first digit of channel 20. An inadvertent or mistaken entry of a single digit will cause mistuning and frustration on the part of the viewer unless some indication of an improper entry is provided. The prior art, as indicated above, discloses a number of digital tuning systems having displays of a tuned channel number but none employ a display device in an interactive manner to indicate when a complete channel number has been selected.

OBJECTS OF THE INVENTION

An object of this invention is to provide a novel tuning system.

Another object of this invention is to provide an improved tuning system which provides a visual indication when channel numbers have been selected.

SUMMARY OF THE INVENTION

In accordance with the invention a television tuning control system and method comprises a tuning means responsive to two digit channel number inputs, memory means coupled to the tuning means for storing a desired sequentially entered two digit channel number, including single digit channel numbers having zero for a tens digit, display means for displaying the digits of a stored channel number in appropriate units and tens display areas and decode means for enabling the display of the first entered digit of a desired channel number in the tens display area, while blanking the units display area, and enabling display of digits in both display areas only after completion of a second digit entry.

BRIEF DESCRIPTION OF THE DRAWINGS

The features of the present invention which are believed to be novel are set forth with particularity in the appended claims. The invention, together with further objects and advantages thereof, may best be understood by reference to the following description taken in conjunction with the accompanying drawings, in the several figures of which like reference numerals identify like elements, and in which:

DESCRIPTION OF THE PREFERRED EMBODIMENT

Figure 1:
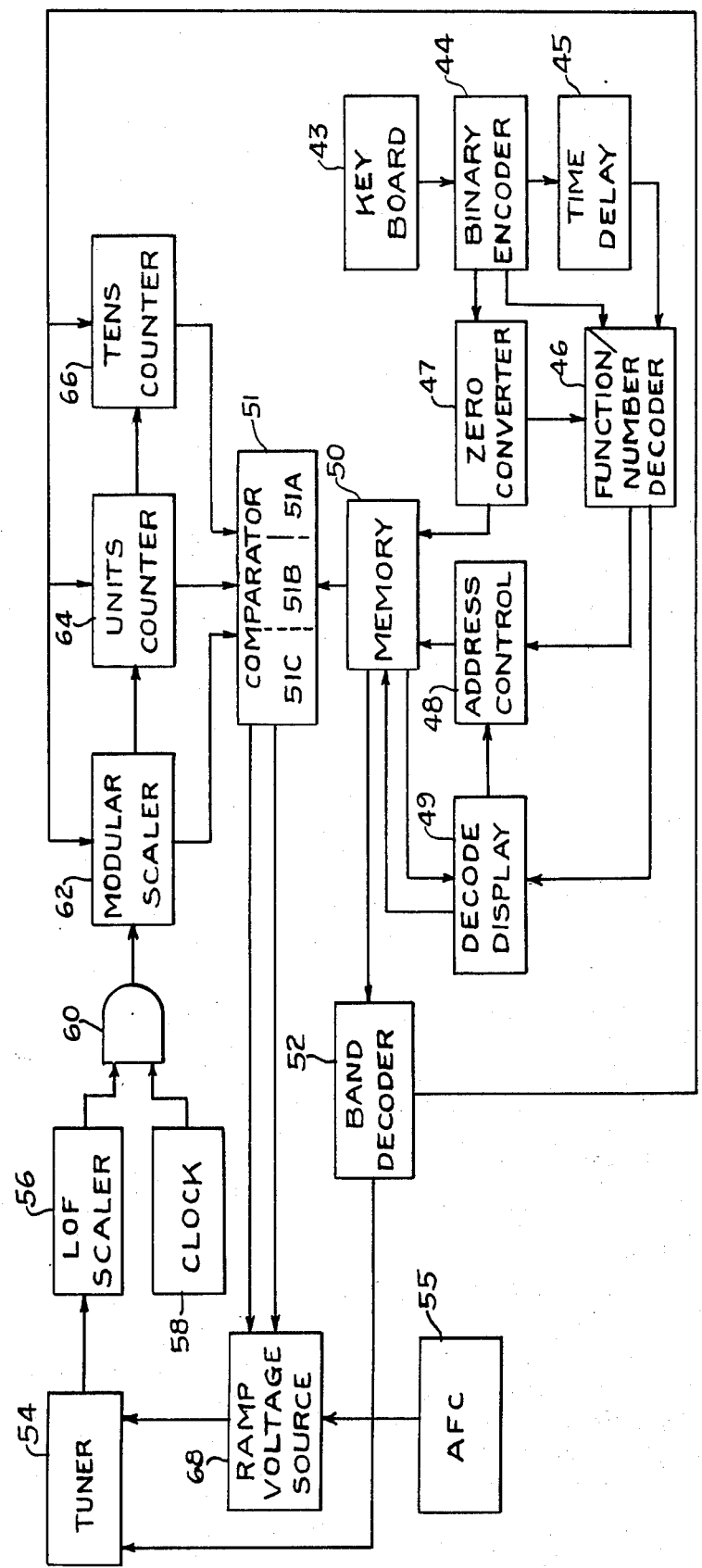
FIG. 1 depicts, in block diagram form, a tuning system employing the invention.

FIG. 1 is a block diagram depicting a tuning control system constructed in accordance with the invention. A channel number keyboard 43 includes means for entering either desired channel number information or tuning commands to tune the tuner. The keyboard information is encoded into a special binary representation in encoder 44, supplied to a zero converter 47 and, both directly and through a time delay system 45, to a function/number decoder 46. The purpose of time delay system 45 is to eliminate spurious signals which might be generated by keyboard contact bounce. The directly supplied information to decoder 46 assists in the determination of the proper address or position in a memory 50. Zero ocnverter 47 functions to alter the special binary representation used in the encoder to the standard binary representation employed in the remainder of the system. The output of zero converter 47 supplies channel number information in standard binary form to the designated position in memory 50.

The keyboard input can be either a channel number digit or an Up or Down tuning command. The word "command" is used throughout to indicate an Up or Down signal input. The function/number decoder firstly determines which of an Up or Down command has been given and secondly distinguishes between commands and channel numbers. If an Up or Down command is entered at the keyboard, address control 48 causes an advance to the next position of the memory. Additional commands result in address control 48 sequentially indexing memory 50 through its available memory positions. Connected to the output of memory 50 is a decode/display 49 which provides a visual indication of the channel number at that memory address. Thus, the viewer receives a visual indication of the selected channel information.

The tuning control system has two functional modes designated program and operate. In the program mode, information is entered by the keyboard and stored in the memory by use of the Up or Down commands which cause a serial advancement of accessible memory address positions, whereupon the channel number information is supplied from the keyboard. In the operate mode, an Up or Down command causes advancement to the next sequential address position and information is supplied from the memory to a comparator 51 to cause tuning to the channel represented by the stored channel information. In this mode, a "scratch pad" memory position is automatically accessed upon the input of a channel number and permits direct tuning by the viewer to any selected channel.

Another output of memory 50 is connected to a band decoder 52 which determines, from the encoded channel information stored in memory 50, (1) in which of the several discontinuous frequency bands the selected channel is; (2) whether UHF or VHF circuitry in the tuner is activated; and (3) the preset information supplied to the channel computing means for decoding of the oscillator frequency. Thus, an output of band decoder 52 is connected to a varactor tuner 54 and another output is connected in common to a modular scaler 62, a units counter 64 and a tens counter 66. A conventionally derived automatic frequency control voltage source (AFC) 55 is coupled to a ramp voltage source 68 for maintaining the oscillator frequency tuned to the received signal picture carrier frequency.

The output of a local oscillator frequency (LOF) scaler 56 and the output of a clock pulse generator 58 are coupled to the inputs of a logic gate 60. The signal on the output of gate 60 constitutes the tuning information and comprises a train of oscillator frequency-related pulses in fixed time intervals. The oscillator frequency is determined by counting the number of pulses in an interval. The output of logic gate 60 is connected to modular scaler 62 which, in turn, is connected to units counter 64 which, in turn, is connected to tens counter 66. On a time sample basis, the tuning information is supplied to the appropriately preset modular scaler and counters which, in the preferred embodiment, determine the channel number corresponding to the television frequency to which the tuner is tuned. The circuitry from the LOF scaler to the comparator constitutes the channel computing means.

The outputs of modular scaler 62 and counters 64 and 66 are connected to comparator 51 which has a modular section 51C, a units section 51B and a tens section 51A, where the derived channel number is compared with the desired channel number. As each comparison is made, signals dependent upon the condition of comparator 51 are coupled to ramp voltage source 68 for controlling both the tuning voltage direction and rate of change. The output voltage from ramp voltage source 68 drives tuner 54 to make corrective changes in its local oscillator frequency, until comparator 51 indicates equality between the derived channel number and desired channel number and, as fully described in the above mentioned Tanaka application, that the tuned signal is within a range of frequencies preselected by a "window".

Definitions

For simplicity, only logic connections OR shown in the figures and only voltage sources and grounds necessary to establish the logic control signal levels are shown. Positive logic is used throughout and logic gates are simply referred to by their function names, i.e., AND, NAND, or and NOR, without the word "gate". A 1 represents a high logic (or signal voltage) level and a 0 corresponds to a low logic level. Thus, an AND gate has its output at 1 only if all inputs are at 1; a NAND gate has its output at 0 only if all inputs are at 1; an OR gate has its output at 1 if any input is at 1; and a NOR gate has its output at 0 if any input is at 1. Inverters function to interchange the 1 and 0 levels.

All binary representations are conventionally arranged in descending powers of 2 from left to right. Leads labelled D, B, C and A and D' and C' interchangeably represent binary digits or bits as well as lead identification. Similarly leads may be identified by the functional signals they carry.

The terms "input" and "output" generally indicate the device terminal unless signal is specified. An open circle on an input terminal designates a negative edge triggered device. O represents a timing pulse signal and $\overline{O}$ its inverse or complement. If O is 0, $\overline{O}$ is 1 and vice-versa. The term "inhibit" indicates the condition in which a gate output is no longer dependent upon signals applied to its remaining inputs. The term "enable" designates the condition in which a gate output is dependent upon the signals applied to the remaining inputs. As far as practical, the various portion of the tuning system will be described in detail on a functional basis. Complete detailed descriptions of the channel computing means, ramp generator (two speed), band decoder and clock are in the Tanaka application, which is incorporated by reference herein. For simplicity, however, these details will not be repeated here.

Figure 2:
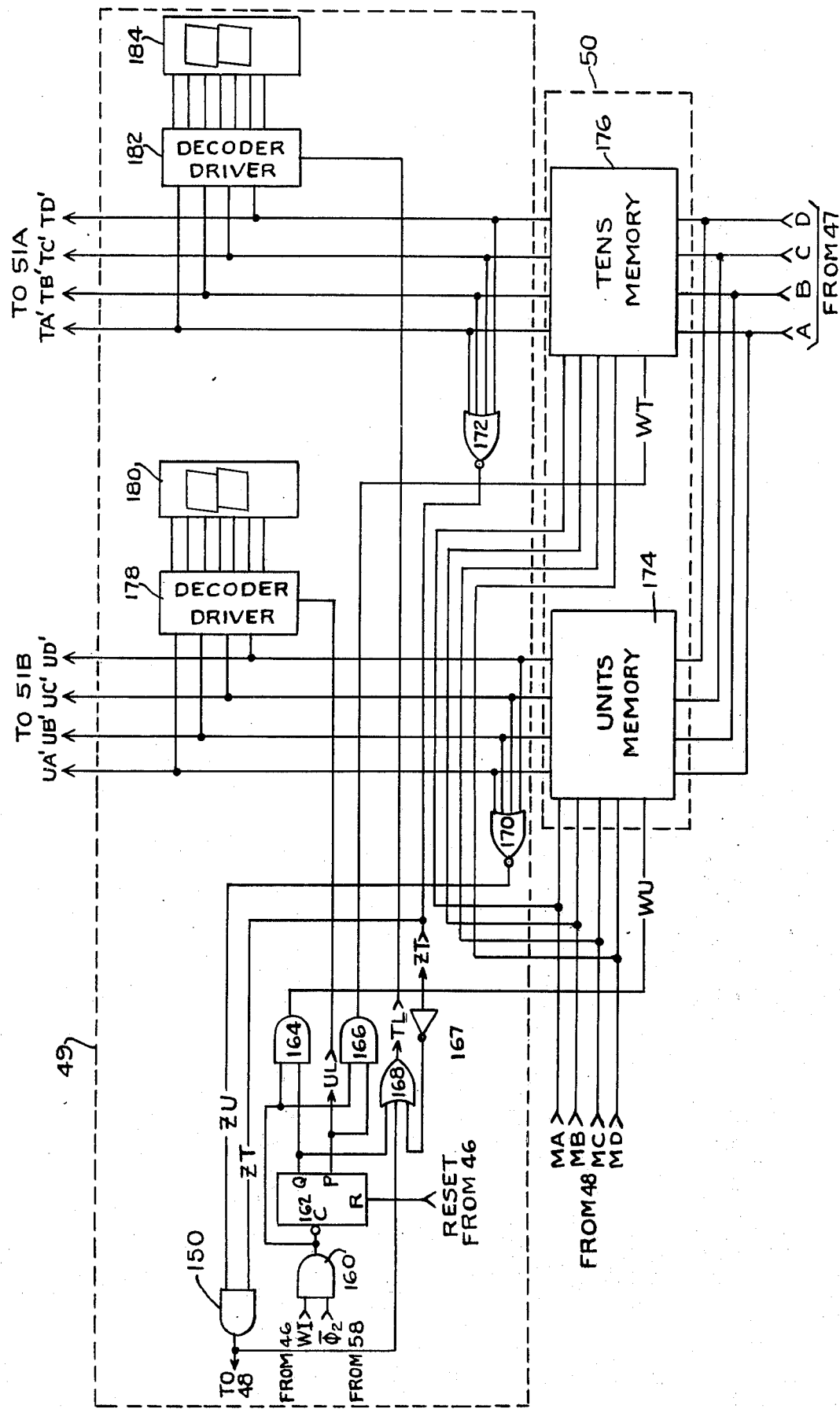
FIG. 2 shows the circuitry of block 49 which comprises the decode display portion of the tuning system showing in detail the logic circuitry providing for appropriate enabling and blanking of the display system.

Decode Display System 49 and Memory 50 (FIG. 2)

Decode display 49 comprises circuitry for identifying units and tens digits from keyboard 43, based on their order of entry, and for activation of the appropriate write-enable signals which permit information to be stored in the corresponding memory. The circuitry also controls blanking and illuminating of the channel number display in a manner which aids the viewer in utilizing the tuning system.

Memory 50 consists of circuitry providing 16 memory positions for recording two digit channel numbers represented by four bits each for the tens and units digits. The memory is shown in two portions, allowing separate write-in and read-out of units and tens channel digit information. Address counter 48 designates the address of a memory position in both memories. The signal levels at the outputs of the counter activate the common memory address inputs. The signal levels on leads A, B, C and D are applied to the memories but are not effective until a write-enable signal is received. The write-enable signal serves to guard the memory inputs from spurious signals. The memory outputs are not guarded and stored channel information at the designated position is always available.

The WI pulse signal is applied along with the $\overline{O}_2$ timing signal from clock 58 to the inputs of an AND 160. The output of AND 160 is connected to a clock terminal (C) of a flip-flop 162 and to one input each of an input of an AND 164 and of an AND 166. The Q output of flip/flop 162 connects to the second input of AND 164 and to one input of an OR 168. The P output of flip/flop 162 supplies a units display control signal, labelled UL, which is coupled to decoder divider 178 and to the second input of AND 166. The output of AND 164, labelled WU, connects to units memory 174 and the output of AND 166, labelled WT, connects to tens memory 176. The WU and WT signals correspond to the write commands for the units and tens memories, respectively. These signals assume a 1 level when permitting writing into the memories and a 0 level when preventing writing into the memories.

The output of a NOR 170, labelled ZU, is connected to one input of an AND 150. The output of a NOR 172, labelled ZT, is connected to the second input of AND 150 and, through an inverter 167, to the second input of OR 168. The output of AND 150 connects to address control 48. It is also connected to the third input of OR 168. The output of OR 168, labelled TL, connects to decoder driver 182 to provide control of the tens display 184. A UL and TL signal level of 1 enables display of the respective units and tens digits while a 0 signal level causes blanking.

Units memory 174 and tens memory 176 are connected to the leads A, B, C and D bearing the binary coded signals from the keyboard. Leads MA, MB, MC and MD from address control 48 comprise the address leads for both memories. Units memory 174 has output leads UA', UB', UC' and UD' connected to NOR 170 for supplying the ZU signal and tens memory 176 has output leads TA', TB', TC' and TD' connected to NOR 172 for supplying the ZT signal. The ZU and ZT leads indicate the presence of 0000 in the memories. Thus, when the stored channel number includes a 0 units or tens digit, the corresponding ZU or ZT leads is at a 1 level.

Decoder driver 178 is also connected to the output leads of units memory 174 and drives a display device 180 for visually displaying the units digit. Similarly, the output leads of tens memory 176 are coupled to a decoder driver 182 which, through its display device 184, permits visual display of the tens digit. Any appropriate combination of decoder driver and display device may be used. Suitable units are manufactured by the Sperry Corporation under the model numbers DD700 and SP752, respectively.

In an actual embodiment of the tuning system incorporating the invention, eight 4-word by 8-bit capacity memory modules, similar to RCA CD 4036 AE are employed. The memories are used in a 4-word by 4-bit configuration to allow separate access to the units and tens digits. Four such memory modules are combined to provide the 16 units memory positions and four more are combined to provide the 16 tens memory positions. It is obvious that many other standard components may be selected and appropriately arranged to provide the same memory capacity and accessibility, and the memory itself, as distinct from the means incorporating it into the tuning system, is not part of the present invention.

Flip/flop 162 is a two state device which distinguishes tens from units digits based on their order of entry at the keyboard. Whenever a number is entered, a 1 level WI pulse signal is generated in function/number decoder 46. This together with a 1 level $\overline{O}_2$ pulse at the input of AND 160 provides a 1 level output pulse to flip/flop 162. The trailing edge of this latter pulse changes the state of the flip/flop. Flip/flop 162 may also receive a RESET signal from function/number decoder 46 which will cause it to assume a particular state so that the next digit received will be treated as a tens digit. The state of the flip/flop is determined by the signal levels at its Q output and P outputs. For the first state, the Q output is 0 and correspondingly the P output is at 1, while the second state has the reverse relationship. The RESET signal is produced only by entry of an Up or Down command at keyboard 43. When such a command is given flip-flop 162 has its P output at a 1 level and is in its first state ready to entry of a tens digit.

The channel number displays operate in a predetermined sequence in response to entry of successive digits. The tens display is blanked for all complete channel numbers less than 10 and the units display is blanked whenever a tens digit is entered. This arrangement serves as a valuable tuning aid for the viewer. Blanking of the tens display avoids a non-standard tens-position 0 for channel numbers less than 10. Thus, while channel 2 is entered at the keyboard as 02, it is displayed as 2.

The units display is blanked immediately after entry of a tens digit to inform the viewer that the selection process is incomplete. This arrangement is advantageous since a channel number is entered one digit at a time, with the first or tens digit being displayed on the left and the second or units digit being displayed on the right. Thus blanking of the units display upon entry of a tens digit informs the viewer that only a single (tens) digit has been entered. Entry of a units digit completes the desired tuning and the display shows the entered channel number. For example, if channel 21 is being displayed and the viewer wishes to change tuning to channel 73, entry of the tens digit 7 results in the tens display reading 7 and the units display being blanked (the system actually tunes to channel 71 because of its fast response time). Upon subsequent entry of the units digit 3, the system tunes to and displays channel number 73.

The units display is directly controlled by the UL signal from the P output of flip/flop 162. When P is at 1 (first state of flip/flop 162) the units digit is displayed. Upon entry of a first (tens) digit, the WI signal (through AND 160) drives flip-flop 162 to its second state; P is now at 0 and the units display is blanked. Upon entry of a second (units) digit, flip/flop 162 resumes its first state (P at 1) and enables display of the units digit. The tens digit is blanked when all inputs of OR 168 are at 0. This condition is met when flip/flop 162 is in its second state (Q at 0), ZT is at 1 and either ZU or ZT is at 0.

Leads A, B, C and D are directly connected to units memory 174 and to tens memory 176. If the keyboard input is a command, no WI pulse signal is produced, neither memory receives a write-enable (WU or WT) signal, and the information on the leads is not stored in the memory. However, address control 48 always "addresses" a memory position to which the tuning system responds (by tuning to the frequency corresponding to the channel number information stored at that memory position).

The invention disclosed provides an apparatus and method for tuning an all channel television control system with a tens and units channel number display device. The tuning system responds to the entry of two digit channel numbers with the first entered digit displayed in the tens position while the units position is blanked to indicate an incomplete two digit entry. Both positions are displayed only for completed two digit channel numbers. This sequenced display provides the viewer with an indication of when the proper number of digits have been entered for tuning.

While a particular embodiment of the invention has been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

What is claimed is:

1. A television tuning system for selectively tuning a plurality of fixed frequency bandwidth television channels identified by single and two digit channel numbers, comprising:
   tuning means responsive to two digit channel number inputs for tuning to said plurality of fixed frequency bandwidth television channels;
   memory means coupled to said tuning means for storing a desired sequentially entered two digit channel number including single digit channel numbers having zero for a tens digit;
   display means for displaying the digits of a stored channel number in tens and units display areas; and
   decode means coupled to said display means enabling the display of the first entered digit of said desired channel number in the tens display area and blanking the units display area and for enabling display of digits in both display areas only after completion of a second digit entry.

2. The television tuning system of claim 1 wherein said decode means further include means having alternative units and tens states with said alternative states corresponding to the entry of first and second digits respectively.

3. The television tuning system of claim 2 wherein said means having alternative units and tens states comprises a flip/flop.

4. The television tuning system of claim 3 further including keyboard means coupled to said memory means and to said decode means, said keyboard means comprising 10 digit keys for entry of individual digits of desired channel numbers.

5. The television tuning system of claim 4 wherein said memory means comprise separate first and second memory devices for storing the digits of said desired channel numbers, and wherein said flip/flop is coupled to said separate memory devices permitting access from said keyboard means to said first memory device for tens digit and to said second memory device for units digits.

6. The television tuning system of claim 5 further including a function/number decoder coupled to said keyboard means for changing the state of said flip/flop upon entry of a digit.

7. The television tuning system of claim 6 wherein said keyboard means binary encodes the digits of said desired channel number and said memory means stores said encoded digits in binary form.

8. The television tuning system of claim 7 wherein said memory means includes a plurality of locations, and said keyboard means includes storage and recall switch means, and further including address control means for serially accessing said locations and for conditioning said flip/flop to assume a particular state in anticipation of a digit entry responsive to said storage and recall means.

9. The television tuning system of claim 8 wherein said display means is coupled to said memory means and wherein said decode means are operable during recall of stored channel numbers less than 10 for blanking the tens area zero in said display means.

10. In a television tuning system including tuning means responsive to two digit channel number inputs for tuning a plurality of fixed frequency bandwidth television channels identified by channel numbers, memory means for storing a sequentially entered desired two digit channel number including single digit channel numbers having zero as a tens digit and display means for displaying the tens and units digits of said desired channel number in tens and units display areas, the method of operating said television tuning system comprising the steps of:
    storing in said memory means the tens digit of the desired number;
    displaying said tens digit in the tens display area of said display means and blanking the units display area to indicate a partial channel number entry;
    storing the units digit of said desired number in said memory means; and
    displaying the units digit in the units display area of said display means while continuing to display said tens digit to indicate a complete channel number entry.

11. The method of operating the television tuning system of claim 10 wherein said memory means includes a plurality of serially accessible memory locations and is operable for sequentially recalling stored channel numbers for tuning said tuning means, the further step of:
    blanking the tens area zero in said display means on recall of stored channel numbers less than ten.

12. A television tuning system for selectively tuning a plurality of fixed frequency bandwidth television channels identified by single and two digit channel numbers, comprising:
    tuning means responsive to two digit channel number inputs for tuning to said plurality of fixed frequency bandwidth television channels;
    memory means coupled to said tuning means for storing a desired sequentially entered two digit channel number including single digit channel numbers having zero for a tens digit;
    display means for displaying the digits of a stored channel number in tens and units display areas;
    decode means coupled to said display means enabling the display of the first entered digit of said desired channel number in the tens display area and blanking the units display area and for enabling display of digits in both display areas only after completion of a second digit entry; and blanking means for suppressing leading zeros of a complete channel number.

13. In a television tuning system including tuning means responsive to two digit channel number inputs for tuning a plurality of fixed frequency bandwidth television channels identified by channel numbers, memory means for storing a sequentially entered desired two digit channel number including single digit channel numbers having zero as a tens digit and display means for displaying the tens and units digits of said desired channel number in tens and units display areas, the method of operating said television tuning system comprising the steps of:

storing in said memory means the tens digit of the desired number;

displaying said tens digit in the tens display area of said display means and blanking the units display area to indicate a partial channel number entry;

storing the units digit of said desired number in said memory means;

displaying the units digit in the units display area of said display means while continuing to display said tens digit to indicate a complete channel number entry; and blanking the tens digit display area for zero tens digits.

* * * * *